United States Patent [19]

Nakatani

[11] Patent Number: 4,492,892

[45] Date of Patent: Jan. 8, 1985

[54] PIEZOELECTRIC RESONATOR DEVICE SUPPORTED BY ANISOTROPIC RUBBER CONDUCTOR

[75] Inventor: Hiroshi Nakatani, Kanazawa, Japan

[73] Assignee: Murata Manufacturing Co., Ltd., Nagaokakyo, Japan

[21] Appl. No.: 601,848

[22] Filed: Apr. 19, 1984

[30] Foreign Application Priority Data

May 25, 1983 [JP] Japan .............................. 58-79404[U]

[51] Int. Cl.³ ............................................ H01L 41/08
[52] U.S. Cl. .................................... 310/345; 310/354; 310/363
[58] Field of Search ............... 310/345, 363, 364, 348, 310/351-356

[56] References Cited

U.S. PATENT DOCUMENTS

| | | | |
|---|---|---|---|
| 3,622,813 | 11/1971 | Kumon | 310/345 |
| 3,851,194 | 11/1974 | Kawada | 310/345 |
| 4,267,480 | 5/1981 | Kanematsu et al. | 310/354 X |
| 4,308,482 | 12/1981 | Kadohashi | 310/354 |
| 4,322,652 | 3/1982 | Otsuka | 310/354 X |
| 4,360,754 | 11/1982 | Toyoshima et al. | 310/354 X |
| 4,431,938 | 2/1984 | Inoue | 310/355 X |

Primary Examiner—Mark O. Budd
Attorney, Agent, or Firm—Wenderoth, Lind & Ponack

[57] ABSTRACT

A piezoelectric resonator device includes a piezoelectric resonator element accommodated in a casing. Inside the casing, the piezoelectric resonator device is held between two terminal plates through an anisotropic conduction pliable sheet which also extends on opposite sides of piezoelectric element to prevent the piezoelectric element from being moved sideways inside the casing.

7 Claims, 7 Drawing Figures

PIEZOELECTRIC RESONATOR DEVICE SUPPORTED BY ANISOTROPIC RUBBER CONDUCTOR

BACKGROUND OF THE INVENTION

1. Field of the invention

The present invention relates to a piezoelectric resonator device and, more particularly, to an improved arrangement of such a piezoelectric resonator device.

2. Description of the Prior Art

One prior art piezoelectric resonator device is shown in FIGS. 1, 2 and 3. It includes inner casing 4 having a rectangular opening formed therein with four pointed fingers 4a, 4b, 4c and 4d inwardly extending. A base plate 6 made of metal and having a projection 6a is placed under inner casing 4, thereby closing the bottom of the inner casing 4. An anisotropic conduction pliable sheet such as a layer of rubber sheet 7 containing particles of electric conductive elements aligned in its thickness direction of the rubber sheet for permitting electric connection only in its thickness direction is inserted in a space defined by four fingers 4a, 4b, 4c and 4d. A piezoelectric resonator element 3 deposited with opposite electrodes 1 and 2 is installed in inner casing 4, as best shown in FIG. 2. A top plate 5 made of metal and having a spring arm 5a is placed over inner casing 4, thereby closing the top of casing 4. Then, inner casing 4 is inserted in an outer casing 8, as shown in FIG. 3. Thus, piezoelectric resonator element 3 is held between projection 6a and spring arm 5a through rubber sheet 7 at approximately center of element 3 where the node of vibration exists.

An electric connection to piezoelectric resonator element 3 is effected by top plate 5 through rubber sheet 3 and bottom plate 6.

According to the prior art resonator device described above, four fingers 4a, 4b, 4c and 4d are provided to prevent piezoelectric element 3 from being moved side directions, such as shown by arrows A, thereby preventing it from touching the inner wall of inner casing 4. However, when these fingers 4a to 4d touch the piezoelectric element 3, the mechanical quality factor Qm of piezoelectric element 3 becomes poor, thereby deteriorating its impedance characteristic from curve h1 to curve h2, shown in FIG. 4.

SUMMARY OF THE INVENTION

The present invention has been developed with a view to substantially solving the above described disadvantages and has for its essential object to provide an improved piezoelectric resonator device which can prevent the piezoelectric element from touching the inner wall of the casing without employing fingers.

It is another object of the present invention to provide an improved piezoelectric resonator device which is simple in construction and can readily be manufactured at low cost.

In accomplishing these and other objects, a piezoelectric resonator device according to the present invention comprises a piezoelectric resonator element accommodated in a casing. Inside the casing, the piezoelectric resonator device is held between two terminal projections through an anisotropic conduction pliable sheet which also extends on opposite sides of piezoelectric element.

BRIEF DESCRIPTION OF THE DRAWINGS

These and other objects and features of the present invention will become apparent from the following description taken in conjunction with a preferred embodiment thereof with reference to the accompanying drawings, throughout which like parts are designated by like reference numerals, and in which.

DESCRIPTION OF THE PREFERRED EMBODIMENTS

Figure 1:
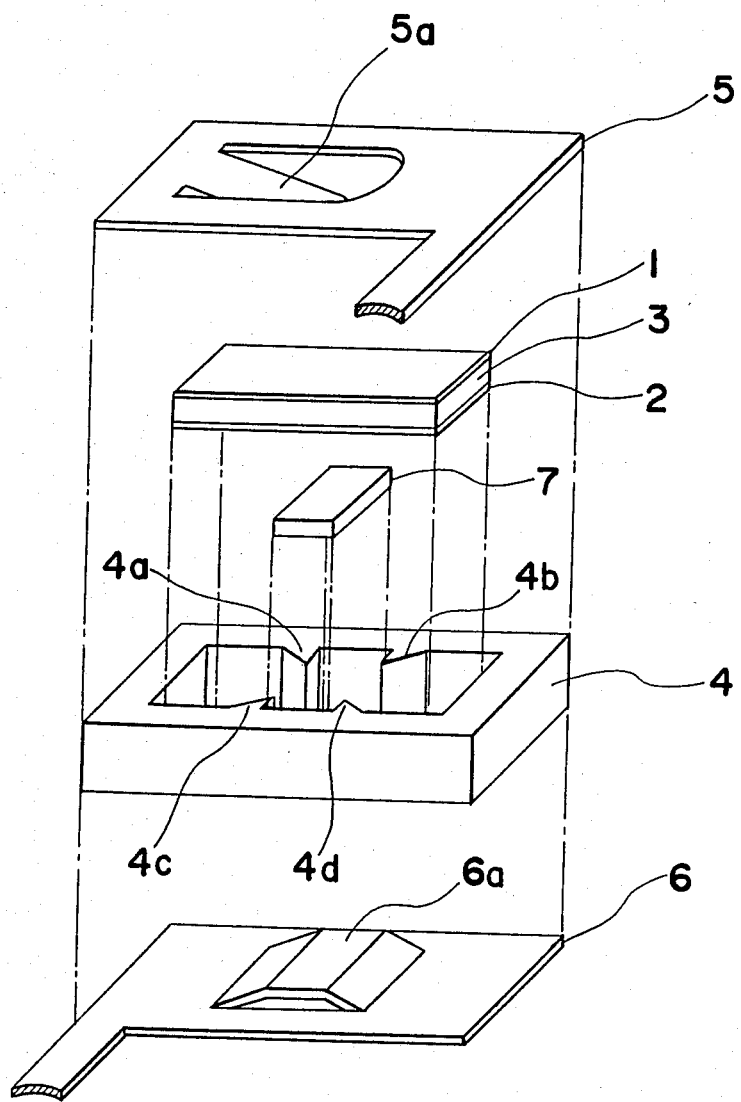
FIG. 1 is an exploded view of a piezoelectric resonator device according to the prior art.
Figure 2:
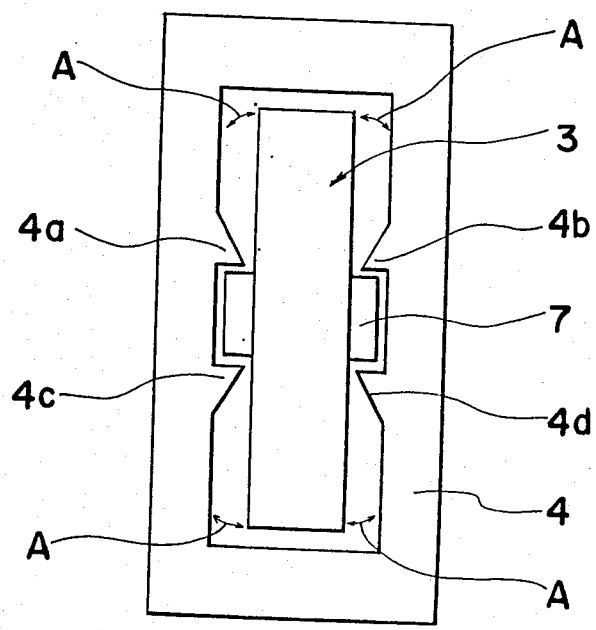
FIG. 2 is a top plan view of the piezoelectric resonator device of FIG. 1 with its top plate removed.
Figure 3:
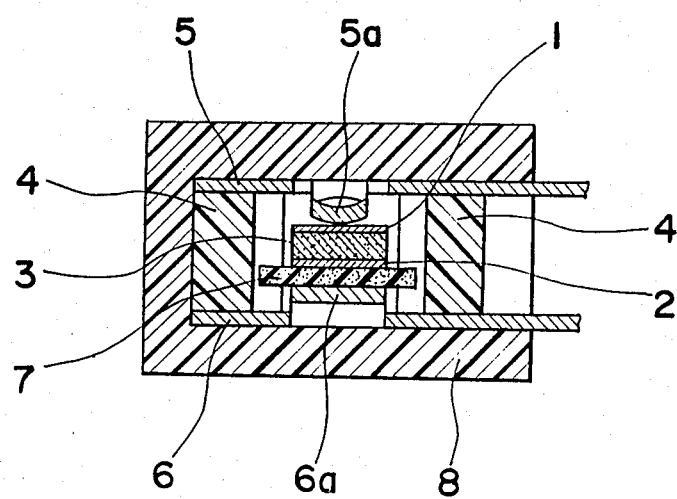
FIG. 3 is a cross-sectional view of the piezoelectric resonator device of FIG. 1.
Figure 4:
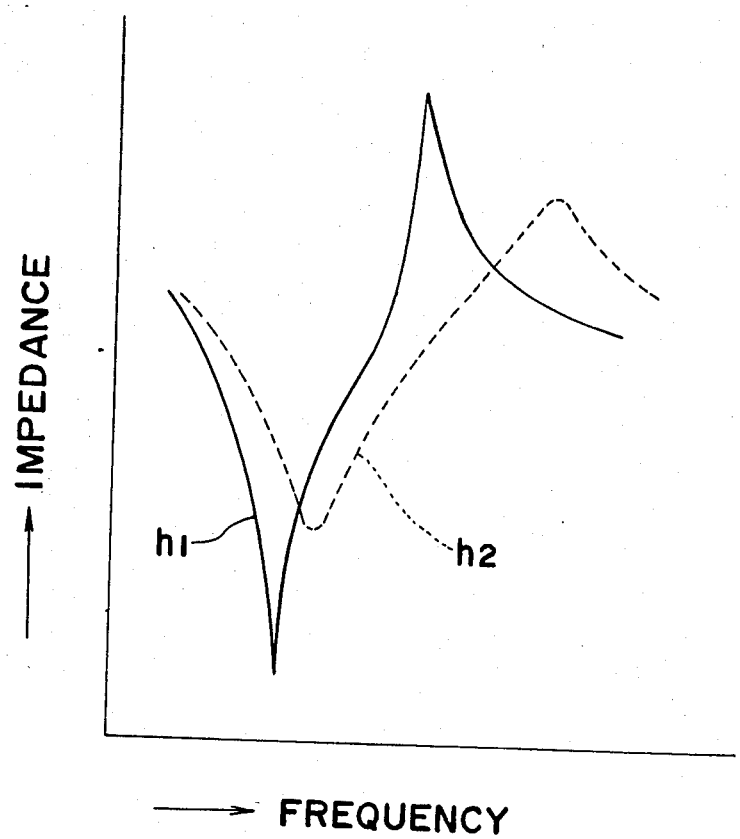
FIG. 4 is a graph showing impedance characteristic of the piezoelectric resonator device of FIG. 1.
Figure 5:
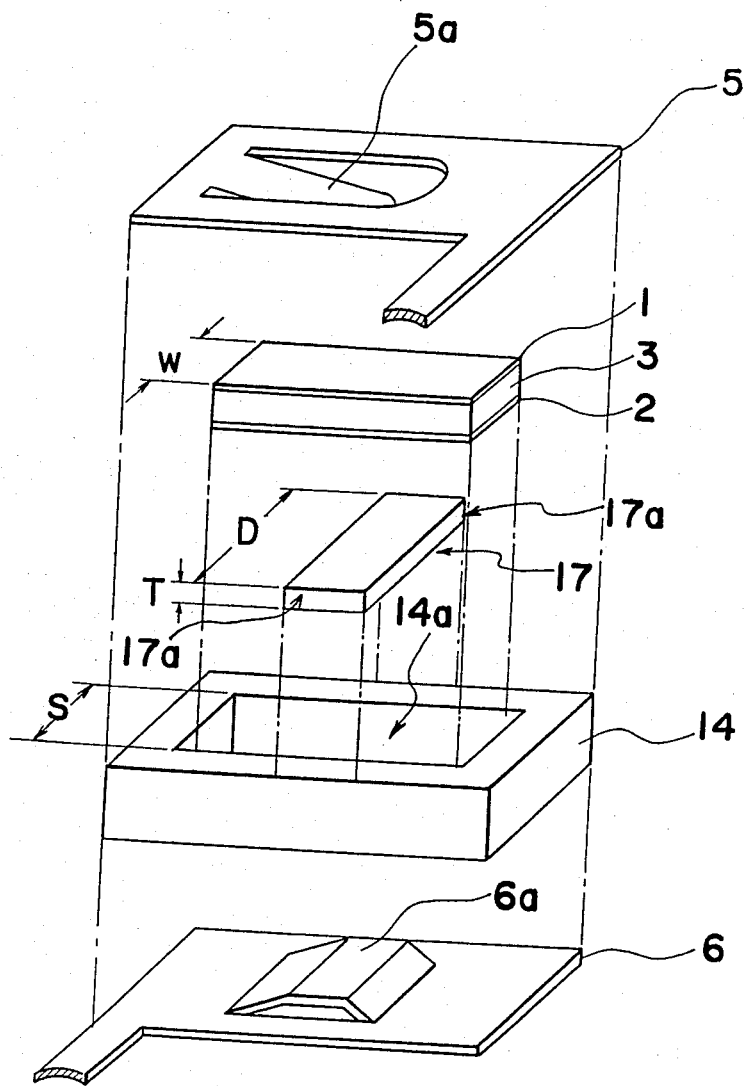
FIG. 5 is an exploded view of a piezoelectric resonator device according to a preferred embodiment of the present invention.
Figure 6:
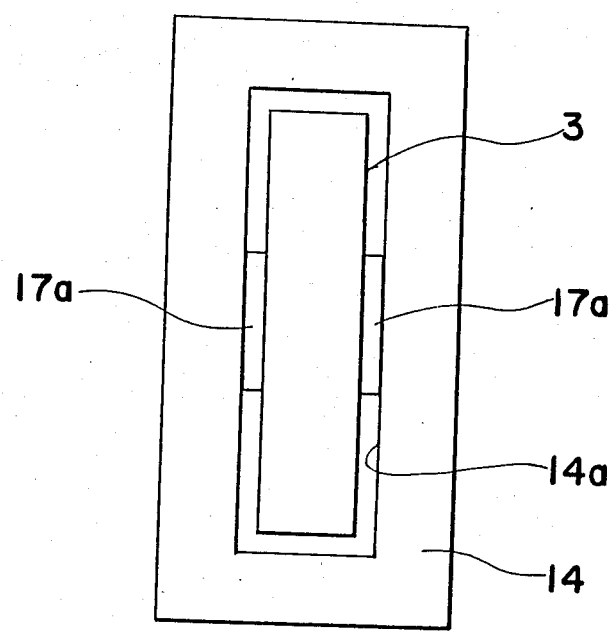
FIG. 6 is a top plan view of the piezoelectric resonator device of FIG. 5 with its top plate removed.

Referring to FIG. 5, a piezoelectric resonator device according to a preferred embodiment of the present invention comprises an inner casing 14 having a rectangular opening 14a formed therein. Opening 14a has a width S.

A base plate 6 made of metal and having a projection 6a is placed under inner casing 4, thereby closing the bottom of inner casing 14 with projection 6a extending into opening 14a.

An anisotropic conduction pliable sheet such as a layer of a rubber sheet 17 containing particles of electric conductive elements aligned in its thickness direction of the rubber sheet for permitting electric connection only in its thickness direction is accommodated in casing 14 and is placed on projection 6a in a mannner described later. It is to be noted that rubber sheet 17 has a thickness T and a length D which is longer than the width S of opening 14a.

A piezoelectric resonator element 3 deposited with electrodes 1 and 2 on its opposite surfaces has a width W which is smaller than the width S, but is slightly greater than the difference S-2T.

A top plate 5 made of metal and having a projection 5a, defined by an arm serving as a leaf spring, is placed over inner casing 4 with said projection 5a extending into the opening 14a, thereby closing the top of casing 14.

The piezoelectric resonator device is made in the following steps. Rubber sheet 17 is placed across opening 14a such that the lengthwise axis of rubber sheet 17 crosses the lengthwise axis of opening 14a at the respective centers at right-angled relationship to each other. Thereafter, piezoelectric resonator element 3 is placed across the rubber sheet 17 at the center thereof so that the lengthwise axis of element 3 is parallel to that of opening 14a. Then, piezoelectric resonator element 3 is forcibly pushed into inner casing 14, with a resultant such that the rubber sheet 17 is bent in a shape of U, as shown in FIG. 7, supporting bottom face by a rubber sheet portion 17a and, at the same time, holding opposite side faces of piezoelectric resonator element 3 between rubber sheet portions 17a and 17b.

It is to be note that rubber sheet portions 17a, 17b and 17c can be provided separately from each other.

Then, top and bottom plates 5 and 6 are provided at opposite ends of the opening 14a, thereby holding piezoelectric resonator element 3 between spring arm 5a and projection 6a through rubber sheet 17 at approximately center of element 3 where the node of vibration exists.

Figure 7:
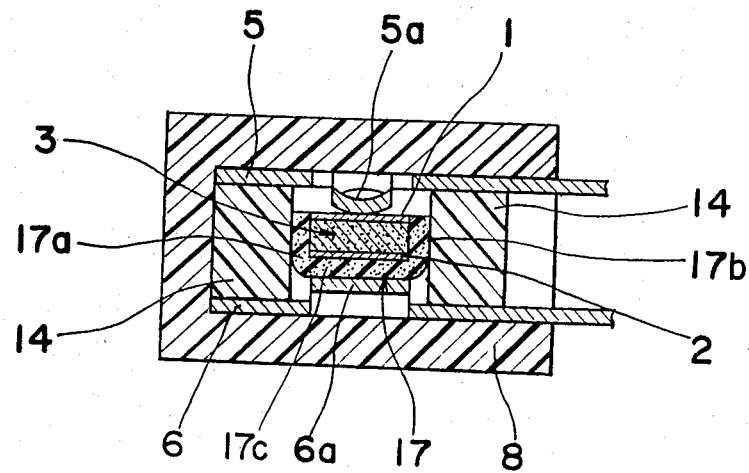
FIG. 7 is a cross-sectional view of the piezoelectric resonator device of FIG. 5.

When the piezoelectric resonator element 3 is accommodated in inner casing 4 in a manner described above, an outer casing 8 is mounted, as shown in FIG. 7, so as to maintain top and bottom plates 5 and 6 tightly at opposite ends of inner casing 14.

An electric connection to piezoelectric resonator element 3 is effected by top plate 5 and bottom plate 6 through rubber sheet 17. Since rubber sheet 17 is electrically conductive only in its thickness direction, no electric connection is effected between two electrodes 1 and 2 through rubber sheet 17.

According to the present invention, since rubber sheet 17 holds opposite sides of the piezoelectric resonator element 3, element 3 will not be undesirably shifted sideways inside inner casing 14, resulting in no directly contact between element 3 and inner casing 14. Accordingly, the quality factor Qm of piezoelectric resonator element 3 can be maintained at a high level.

It is to be noted that the present invention can be applied not only to a piezoelectric resonator element of two terminal type described above, but also to a three terminal type.

It is also to be noted that projections 5a and 6a formed on plates 5 and 6, respectively, can be eliminated to effect a direct contact of plate 5 with piezoelectric resonator 3 or a direct contact of plate 6 with rubber sheet 17. Instead of the above, the projections 5a and 6a can be replaced with any other contact means, such as coil spring or additional conductive rubber sheet.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of appended claims.

What is claimed is:

1. A piezoelectric resonator device comprising:
   a first casing having a through-hole opening formed therein, said opening defining first and second side walls;
   a first plate made of electrically conductive material applied at one end of said through-hole opening;
   a second plate made of electrically conductive material applied at other end of said through-hole opening, thereby defining a cavity inside said first casing;
   a rectangular plate shaped piezoelectric resonator element deposited with at least first and second electrodes at opposite surfaces, respectively, and having a configuration smaller than said cavity, said resonator element accommodated in said cavity such that said first electrode is facing said first plate and said second electrode is facing said second plate;
   first anisotropic conduction pliable sheet pressure fitted between said first electrode and said first plate, thereby holding said piezoelectric resonator element between said first and second plates through said first anisotropic conduction pliable sheet;
   second anisotropic conduction pliable sheet pressure fitted between one elongated side of said piezoelectric resonator element and said first side wall; and
   third anisotropic conduction pliable sheet pressure fitted between other elongated side of said piezoelectric resonator element and said second side wall.

2. A piezoelectric resonator device comprising:
   a first casing having a through-hole opening formed therein, said opening defining first and second side walls;
   a first plate made of electrically conductive material applied at one end of said through-hole opening, said first plate having a first projection extending into said opening;
   a second plate made of electrically conductive material applied at other end of said through-hole opening, thereby defining a cavity inside said first casing, said second plate having a second projection extending into said opening;
   a rectangular plate shaped piezoelectric resonator element deposited with at least first and second electrodes at opposite surfaces, respectively, and having a configuration smaller than said cavity, said resonator element accommodated in said cavity such that said first electrode is facing said first projection and said second electrode is facing said second projection;
   first anisotropic conduction pliable sheet pressure fitted between said first electrode and said first projection, thereby holding said piezoelectric resonator element between said first and second projections through said first anisotropic conduction pliable sheet;
   second anisotropic conduction pliable sheet pressure fitted between one elongated side of said piezoelectric resonator element and said first side wall; and
   third anisotropic conduction pliable sheet pressure fitted between other elongated side of said piezoelectric resonator element and said second side wall.

3. A piezoelectric resonator device as claimed in claim 2, wherein said first, second and third anisotropic conduction pliable sheets are integrally formed with each other.

4. A piezoelectric resonator device as claimed in claim 2, further comprising a second casing into which said first casing is accommodated.

5. A piezoelectric resonator device as claimed in claim 2, wherein said second projection is a leaf spring extending from said second plate.

6. A piezoelectric resonator device comprising:
   a first casing having a through-hole opening formed therein, said opening defining first and second side walls;
   a first plate made of electrically conductive material applied at one end of said through-hole opening;
   a second plate made of electrically conductive material applied at other end of said through-hole opening, thereby defining a cavity inside said first casing;
   a rectangular plate shaped piezoelectric resonator element deposited with at least first and second electrodes at opposite surfaces, respectively, and having a configuration smaller than said cavity, said resonator element accommodated in said cavity such that said first electrode is facing said first plate and said second electrode is facing said second plate;

an elongate anisotropic conduction pliable sheet having its center portion pressure fitted between said first electrode and said first plate, thereby holding said piezoelectric resonator element between said first and second plates through said center portion of said anisotropic conduction pliable sheet;

said anisotropic conduction pliable sheet having its one end portion pressure fitted between one elongated side of said piezoelectric resonator element and said first side wall; and said anisotropic conduction pliable sheet having its other end portion pressure fitted between other elongated side of said piezoelectric resonator element and said second side wall.

7. A piezoelectric resonator device comprising:

a first casing having a through-hole opening formed therein, said opening defining first and second side walls;

a first plate made of electrically conductive material applied at one end of said through-hole opening, said first plate having a first projection extending into said opening;

a second plate made of electrically conductive material applied at other end of said through-hole opening, thereby defining a cavity inside said first casing, said second plate having a second projection extending into said opening;

a rectangular plate shaped piezoelectric resonator element deposited with at least first and second electrodes at opposite surfaces, respectively, and having a configuration smaller than said cavity, said resonator element accommodated in said cavity such that said first electrode is facing said first projection and said second electrode is facing said second projection;

an elongate anisotropic conduction pliable sheet having its center portion pressure fitted between said first electrode and said first projection, thereby holding said piezoelectric resonator element between said first and second projections through said center portion of said anisotropic conduction pliable sheet;

said anisotropic conduction pliable sheet having its one end portion pressure fitted between one elongated side of said piezoelectric resonator element and said first side wall; and said anisotropic conduction pliable sheet having its other end portion pressure fitted between other elongated side of said piezoelectric resonator element and said second side wall.

* * * * *